(12) United States Patent
Hata et al.

(10) Patent No.: US 6,936,861 B2
(45) Date of Patent: Aug. 30, 2005

(54) NITRIDE-BASED COMPOUND SEMICONDUCTOR LIGHT-EMITTING ELEMENT AND METHOD FOR PRODUCING SAME

(75) Inventors: Toshio Hata, Mihara (JP); Mayuko Fudeta, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 66 days.

(21) Appl. No.: 10/309,942

(22) Filed: Dec. 3, 2002

(65) Prior Publication Data

US 2003/0102484 A1 Jun. 5, 2003

(30) Foreign Application Priority Data

Dec. 4, 2001 (JP) ...................................... 2001-370658

(51) Int. Cl.[7] .............................................. H01L 33/00
(52) U.S. Cl. ......................................... 257/99; 257/81
(58) Field of Search .................................... 257/81, 99

(56) References Cited

U.S. PATENT DOCUMENTS 5,959,401 A * 9/1999 Asami et al. ............... 313/503
6,225,648 B1 * 5/2001 Hsieh et al. ................. 257/95

FOREIGN PATENT DOCUMENTS

JP 11-177142 7/1999

* cited by examiner

Primary Examiner—Jerome Jackson
(74) Attorney, Agent, or Firm—Morrison & Foerster LLP

(57) ABSTRACT

A nitride-based compound semiconductor light-emitting element of the present invention includes: a P-type electrode; a P-type nitride-based compound semiconductor layer disposed on the P-type electrode; a light-emitting layer disposed on the P-type nitride-based compound semiconductor layer and emitting light; a nitride-based compound semiconductor layer disposed on the light-emitting layer and transmitting light emitted by the light-emitting layer therethrough; a buffer layer disposed on the nitride-based compound semiconductor layer and transmitting the light therethrough, wherein the buffer layer is made of a nitride-based compound semiconductor material and a trench is formed in the buffer layer so as to expose portions of the nitride-based compound semiconductor layer; and an N-type electrode disposed so as to cover the trench and electrically connected to the nitride-based compound semiconductor layer.

13 Claims, 9 Drawing Sheets

CONVENTIONAL ART

NITRIDE-BASED COMPOUND SEMICONDUCTOR LIGHT-EMITTING ELEMENT AND METHOD FOR PRODUCING SAME

BACKGROUND OF THE INVENTION

1. Field of the Invention

The present invention relates to a semiconductor light-emitting element, and in particular to a nitride-based compound semiconductor light-emitting element capable of emitting light with wavelengths ranging from a blue region to an ultraviolet region. The present invention also relates to a method for producing such a semiconductor light-emitting element.

2. Description of the Related Art

It is known that a nitride-based compound can be used in a semiconductor light-emitting element capable of emitting light with wavelengths ranging from a blue region to an ultraviolet region. For example, Japanese Laid-Open Patent Publication No. 11-177142 discloses a structure of a conventional nitride-based compound semiconductor light-emitting element using a nitride-based compound.

FIG. 9 is a cross-sectional view of a conventional nitride-based compound semiconductor light-emitting element 90 when viewed from the front. The nitride-based compound semiconductor light-emitting element 90 includes: a silicon (Si) substrate 95 having an N-type electrode 98 formed on the bottom surface thereof; a buffer layer 94 on the Si substrate 95; a lower cladding layer 93 on the buffer layer 94; a light-emitting layer 92 on the lower cladding layer 93; and an upper cladding layer 91 on the light-emitting layer 92. The upper cladding layer 91 includes a p-type pad electrode 96 for injecting current into the light-emitting layer 92 on a substantial center portion of the upper cladding layer 91. A gold (Au) conductor wire 97 for externally supplying current to the P-type pad electrode 96 is bonded to the top surface of the p-type pad electrode 96.

In the nitride-based compound semiconductor light-emitting element 90 having the above structure, since the P-type pad electrode 96 is directly formed on the upper cladding layer 91, there is a possibility that any crack might be caused in the upper cladding layer 91 by stress generated in the upper cladding layer 91 when forming the P-type pad electrode 96.

Further, there is a possibility that any crack might be caused to the upper cladding layer 91 by mechanical damage caused to the upper cladding layer 91 when bonding the Au conductor wire 97 to the top surface of the P-type pad electrode 96.

When any crack is caused to the upper cladding layer 91, current flows into the upper cladding layer 91 through the crack, and therefore the nitride-based compound semiconductor light-emitting element 90 is electrically shorted. As a result, there arises a problem that the light-emitting layer 92 might not emit light or might not stably emit light even if the light-emitting layer 92 can emit light.

Furthermore, about 50% of light emitted by the light-emitting layer 92 is absorbed into the Si substrate 95, and therefore there arises a problem that the luminous efficiency of the nitride-based compound semiconductor light-emitting element 90 might be reduced.

SUMMARY OF THE INVENTION

According to one aspect of the present invention, there is provided a nitride-based compound semiconductor light-emitting element including: a P-type electrode; a P-type nitride-based compound semiconductor layer disposed on the P-type electrode; a light-emitting layer disposed on the P-type nitride-based compound semiconductor layer and emitting light; a nitride-based compound semiconductor layer disposed on the light-emitting layer and transmitting light emitted by the light-emitting layer therethrough; a buffer layer disposed on the nitride-based compound semiconductor layer and transmitting the light therethrough, wherein the buffer layer is made of a nitride-based compound semiconductor material and a trench is formed in the buffer layer so as to expose portions of the nitride-based compound semiconductor layer; and an N-type electrode disposed so as to cover the trench and electrically connected to the nitride-based compound semiconductor layer.

In one embodiment of the invention, the buffer layer is an AlN layer.

In one embodiment of the invention, the nitride-based compound semiconductor layer is made of at least one material selected from the group consisting of GaN and InGaN.

In one embodiment of the invention, the buffer layer is deposited so as to cover the entire surface of the nitride-based compound semiconductor layer.

In one embodiment of the invention, the buffer layer has an electrode formation portion defined by the trench, and the N-type electrode is formed so as to cover the trench and the electrode formation portion.

In one embodiment of the invention, the nitride-based compound semiconductor light-emitting element further includes a pad electrode disposed on the N-type electrode, which is formed on the electrode formation portion, and electrically connected to the N-type electrode, the pad electrode injecting current into the nitride-based compound semiconductor layer and the light-emitting layer.

In one embodiment of the invention, the buffer layer includes an electrode formation portion defined by the trench, and the element further comprises a pad electrode disposed on the electrode formation portion and electrically connected to the N-type electrode.

In one embodiment of the invention, the nitride-based compound semiconductor light-emitting element further includes a pad electrode disposed at a position so as not to block light emitted by the light-emitting layer and electrically connected to the N-type electrode.

In one embodiment of the invention, the N-type electrode is a translucent thin film including metal.

In one embodiment of the invention, the N-type electrode is an oxide semiconductor which is a translucent conductor.

In one embodiment of the invention, the nitride-based compound semiconductor light-emitting element further includes a conductive layer in a lower portion of the P-type electrode, the conductive layer supporting a laminated body including: the P-type electrode, the P-type nitride-based compound semiconductor layer, the light-emitting layer, the nitride-based compound semiconductor layer, the buffer layer, and the N-type electrode.

In one embodiment of the invention, the conductive layer is a metal layer formed by plating.

In one embodiment of the invention, the conductive layer is formed by a metal plate or a semiconductor substrate bonded to the P-type electrode.

According to another aspect of the present invention, there is provided a method for producing a nitride-based compound semiconductor light-emitting element including the steps of: forming, on a substrate, a buffer layer made of a nitride-based compound semiconductor material, a nitride-based compound semiconductor layer, a light-emitting layer, and a P-type nitride-based compound semiconductor layer in this order; forming a P-type electrode on the P-type nitride-based compound semiconductor layer; forming a conductive layer on the P-type electrode; removing the substrate after the conductive layer is formed; forming a trench in the buffer layer so as to expose portions of the nitride-based compound semiconductor layer after the substrate is removed; and forming an N-type electrode so as to cover the trench formed for exposing the portions of the nitride-based compound semiconductor layer and so as to be electrically connected to the nitride-based compound semiconductor layer.

In one embodiment of the invention, the substrate is a silicon substrate.

In one embodiment of the invention, the step of removing the substrate includes removing the substrate by etching which uses a mixed liquid in which at least a hydrofluoric acid, a nitric acid, and an acetic acid are mixed together.

In one embodiment of the invention, the N-type electrode has a translucent property.

In one embodiment of the invention, the method for producing a nitride-based compound semiconductor light-emitting element further includes the step of providing a pad electrode for injecting current into the light-emitting layer and the nitride-based compound semiconductor layer so as to be electrically connected to the N-type electrode.

In one embodiment of the invention, the step of forming the N-type electrode includes forming the N-type electrode so as to cover the trench and an electrode formation portion on a surface of the buffer layer defined by the trench, and the step of forming the pad electrode includes providing the pad electrode on the N-type electrode formed on the electrode formation portion.

In one embodiment of the invention, providing the pad electrode includes providing the pad electrode at a position so as not to block light emitted by the light-emitting layer.

In one embodiment of the invention, the buffer layer is an AlN layer.

According to still another aspect of the present invention, there is provided a method for producing a nitride-based compound semiconductor light-emitting element including the steps of: forming, on a substrate, a buffer layer made of a nitride-based compound semiconductor material, a nitride-based compound semiconductor layer, a light-emitting layer, and a P-type nitride-based compound semiconductor layer in this order; forming a P-type electrode on the P-type nitride-based compound semiconductor layer; forming a conductive layer on the P-type electrode; removing the substrate after the conductive layer is formed; forming a trench in the buffer layer so as to expose portions of the nitride-based compound semiconductor layer after the substrate is removed; forming an N-type electrode so as to cover the trench formed for exposing the portions of the nitride-based compound semiconductor layer; and forming a P-type electrode on the P-type nitride-based compound semiconductor layer.

Thus, the invention described herein makes possible the advantages of: (1) providing a nitride-based compound semiconductor light-emitting element having high light emission reliability and a method for producing the same; (2) providing a nitride-based compound semiconductor light-emitting element having substantially no possibility of generation of a crack and a method for producing the same; and (3) providing a nitride-based compound semiconductor light-emitting element having high luminous efficiency and a method for producing the same.

These and other advantages of the present invention will become apparent to those skilled in the art upon reading and understanding the following detailed description with reference to the accompanying figures.

DESCRIPTION OF THE PREFERRED EMBODIMENTS

Figure 1:
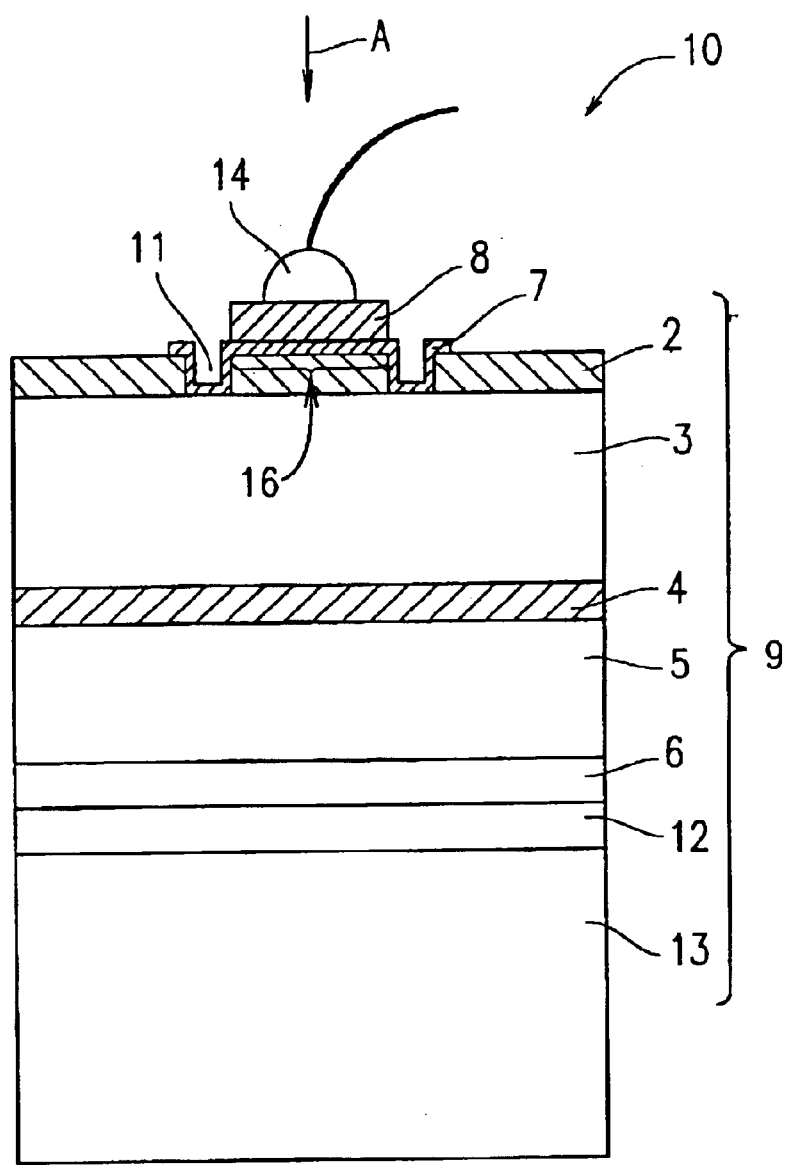
FIG. 1 is a cross-sectional view of a nitride-based compound semiconductor light-emitting element 10 according to Embodiment 1 of the present invention when viewed from the front.

Hereinafter, embodiments of the present invention will be described in detail with reference to the accompanying drawings. In the figures, like elements are denoted by like reference numerals. In the present specification, the "nitride-based compound semiconductor" includes, for example, $In_xAl_yGa_{1-x-y}N$ ($0 \leq x$, $0 \leq y$, $x+y \leq 1$).

Embodiment 1

FIG. 1 is a cross-sectional view of a nitride-based compound semiconductor light-emitting element 10 according to Embodiment 1 of the present invention when viewed from the front. The nitride-based compound semiconductor light-emitting element 10 includes a laminated body 9 having a substantially rectangular parallelepiped shape.

The laminated body 9 includes: a P-type base electrode (conductive layer) 13 having a substantially rectangular parallelepiped shape; a P-type electrode 12 disposed on the P-type base electrode 13; a P-type nitride-based compound semiconductor contact layer 6 disposed on the P-type electrode 12; a P-type nitride-based compound semiconductor layer 5 disposed on the P-type nitride-based compound semiconductor contact layer 6; an MQW (multi quantum well) light-emitting layer 4 disposed on the P-type nitride-based compound semiconductor layer 5; an N-type nitride-based compound semiconductor layer 3 disposed on the MQW light-emitting layer 4; and an aluminum nitride (AlN)

buffer layer 2 disposed on the N-type nitride-based compound semiconductor layer 3. Each layer has a prescribed thickness.

The AlN buffer layer 2 has insulation and transparency properties and covers the entire top surface of the N-type nitride-based compound semiconductor layer 3. The N-type nitride-based compound semiconductor layer 3 is formed of, for example, an N-type gallium nitride (GaN) layer.

The AlN buffer layer 2 includes a trench 11 around a substantial center portion thereof. The trench 11 can be seen as a substantially-squared frame shape when viewed from the direction indicated by arrow A shown in FIG. 1. The trench 11 has a depth as deep as it reaches the N-type nitride-based compound semiconductor layer 3, so that portions of the N-type nitride-based compound semiconductor layer 3 are exposed along the trench 11. The AlN buffer layer 2 includes in the substantial center portion thereof an electrode formation portion 16 having a substantially-squared shape defined by the trench 11.

An N-type translucent electrode 7 is formed so as to cover the trench 11 formed in the AlN buffer layer 2 and the electrode formation portion 16 formed in a surface region of the AlN buffer layer 2, so that the N-type nitride-based compound semiconductor layer 3 and the N-type translucent electrode 7 are electrically connected together. An N-type pad electrode 8 is formed on the N-type translucent electrode 7, which is formed on the electrode formation portion 16, so as to inject current into the MQW light-emitting layer 4 via the N-type translucent electrode 7 and the N-type nitride-based compound semiconductor layer 3, so that the N-type nitride-based compound semiconductor layer 3 and the N-type pad electrode 8 are electrically connected together via the N-type translucent electrode 7. An Au conductor wire 14 is bonded to the N-type pad electrode 8 so as to externally supply current to the N-type pad electrode 8.

The P-type electrode 12 and the P-type base electrode 13 are formed of metal films. The P-type base electrode 13 can be formed by electrolytic plating or non-electrolytic plating so as to have a large area and a large thickness of about 10 microns ($\mu$m). The P-type base electrode 13 can also be formed by gluing metal plates, semiconductor substrates, or the like together.

The P-type electrode 12 and the P-type base electrode 13, which are formed of the metal films, block light emitted by the MQW light-emitting layer 4. The AlN buffer layer 2 having a translucent property transmits light emitted by the MQW light-emitting layer 4 therethrough. Accordingly, the top surface of the AlN buffer layer 2 is used as a main light-emitting surface of the nitride-based compound semiconductor light-emitting element 10.

Next, a method for producing the nitride-based compound semiconductor light-emitting element 10 of FIG. 1 will be described on a step-by-step basis.

Figure 2:
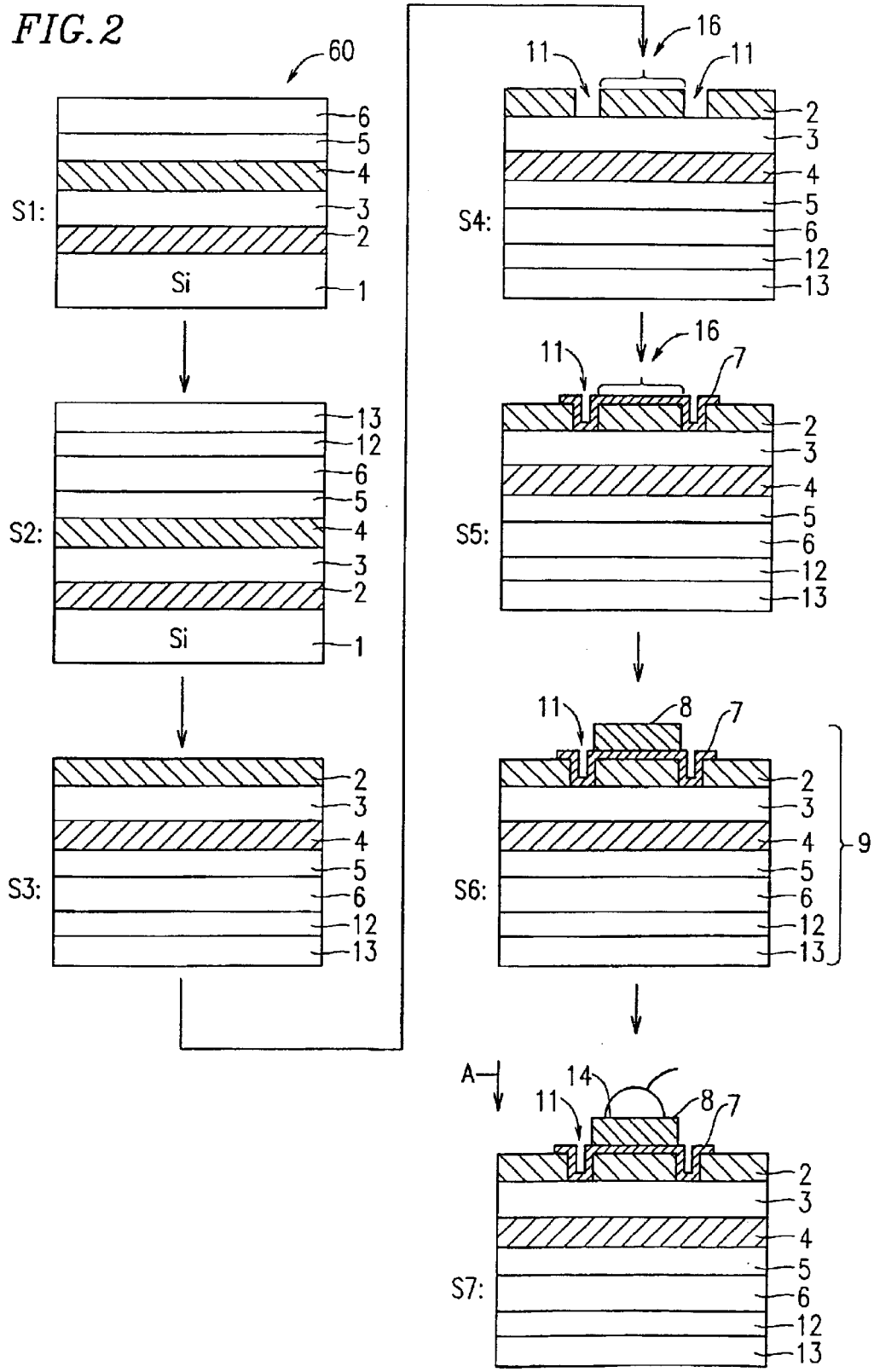
FIG. 2 is a diagram showing the steps of producing the nitride-based compound semiconductor light-emitting element 10 of FIG. 1.

FIG. 2 is a diagram showing the steps of producing the nitride-based compound semiconductor light-emitting element 10.

Step S1: The AlN buffer layer 2, the N-type nitride-based compound semiconductor layer 3, the MQW light-emitting layer 4, the P-type nitride-based compound semiconductor layer 5, and the P-type nitride-based compound semiconductor contact layer 6 are deposited over the S1 substrate 1 in this order using an MOCVD apparatus such that each layer has a prescribed thickness.

More specifically, the top surface of the Si substrate 1 is cleaned firstly. Then, the Si substrate 1 is placed in the MOCVD apparatus. The AlN buffer layer 2 is deposited on the Si substrate 1 in the MOCVD apparatus so as to have a thickness of about 200 nm. An N-type GaN layer is formed as the N-type nitride-based compound semiconductor layer 3 on the AlN buffer layer 2 so as to have a thickness of about 500 nm. The thickness of the N-type GaN layer is preferably from 500 nm or more to 1000 nm or less. When the thickness of the N-type GaN layer is less than 500 nm, the N-type GaN layer is greatly influenced by damage caused by dry etching for forming the trench 11 in the AlN buffer layer 2. When the thickness of the N-type GaN layer is more than 1000 nm, crystallinity of the N-type GaN layer is deteriorated. As a result, crystallinity of the MQW light-emitting layer 4 formed so as to be in contact with the N-type nitride-based compound semiconductor layer 3 is also deteriorated. This is because the N-type nitride-based compound semiconductor layer 3 contributes to reduction in the influence of damage caused by etching and maintenance/improvement of crystallinity of the MQW light-emitting layer 4.

Next, the MQW light-emitting layer 4, the P-type nitride-based compound semiconductor layer 5, and the P-type nitride-based compound semiconductor contact layer 6 are deposited over the N-type nitride-based compound semiconductor layer 3 in this order. The thicknesses of the MQW light-emitting layer 4, the P-type nitride-based compound semiconductor layer 5, and the P-type nitride-based compound semiconductor contact layer 6 are about 50 nm, about 20 nm, and about 250 nm, respectively. In this manner, a wafer 60 is obtained.

Step S2: The wafer 60 is removed from the MOCVD apparatus and Pd (palladium) is formed as the P-type electrode 12 on the P-type nitride-based compound semiconductor contact layer 6 so as to have a thickness of about 50 nm. Then, Ni (nickel) is formed as the P-type base electrode 13 on the P-type electrode 12 so as to have a thickness of about 100 $\mu$m.

Step S3: The Si substrate 1 is removed using a hydrofluoric acid-based etchant which is a mixed liquid in which the proportion of hydrofluoric acid to nitric acid to acetic acid is 10:5:1. Note that the etchant is not limited to the above mixed liquid.

Step S4: The AlN buffer layer 2 is etched by dry etching, such as RIE (reactive ion etching), using chlorine-based gas so as to expose portions of the N-type nitride-based compound semiconductor layer 3. As a result, the trench 11 is formed around a substantial center portion of the AlN buffer layer 2 so as to have the shape of a square in which the length of one side is about 100 $\mu$m. The width of the trench 11 is about 20 $\mu$m. The electrode formation portion 16 defined by the trench 11 is formed in the substantial center portion of the top surface of the AlN buffer layer 2.

Step S5: Metal, e.g., titanium (Ti), of 7 nm in thickness is formed as the N-type translucent electrode 7 so as to cover the trench 11 and the electrode formation portion 16, so that the N-type translucent electrode 7 is in electrical contact with the N-type nitride-based compound semiconductor layer 3.

Step S6: Au is formed as the N-type pad electrode 8 on the N-type translucent electrode 7, which is formed on the electrode formation portion 16, so as to have a thickness of 0.5 $\mu$m. In this manner, the laminated body 9 illustrated in FIG. 1 is obtained.

Step S7: Next, the laminated body 9 is separated into squared pieces each having an area of 350 $\mu$m×350 $\mu$m when viewed from the direction indicated by arrow A shown in FIG. 2. Each squared piece is mounted on a lead frame such that the P-type base electrode 13 is in contact with the bottom of a cup of the lead frame. The P-type base electrode 13 functions as the base of the nitride-based compound semiconductor light-emitting element 10. Next, the Au conductor wire 14 is bonded to the N-type pad electrode 8. In this manner, the nitride-based compound semiconductor light-emitting element 10 of FIG. 1 is obtained. Since the N-type pad electrode 8 does not have a translucent property, a region of the top surface of the AlN buffer layer 2 other than the region where the N-type pad electrode 8 is provided functions as the main light-emitting surface of the nitride-based compound light-emitting element 10. Note that the thickness of each of the above-described layers is merely shown as an example.

Next, referring to FIG. 1, the operation of the nitride-based compound semiconductor light-emitting element 10 obtained according to the above-described steps S1–S7 will be described. Current supplied to the N-type pad electrode 8 by the Au conductor wire 14 is injected into the MQW light-emitting layer 4 via the N-type translucent electrode 7 and the N-type nitride-based compound semiconductor layer 3. The MQW light-emitting layer 4 into which the current is injected emits light. The light emitted by the MQW light-emitting layer 4 passes through the N-type nitride-based compound semiconductor layer 3 and exits through the main light-emitting surface, which corresponds to a region of the top surface of the AlN buffer layer 2 other than the region where the N-type pad electrode 8 is provided, upwardly, i.e., a direction opposite to the direction indicated by arrow A shown in FIG. 1.

Although the example of removing the Si substrate 1 after the P-type electrode 12 and the P-type base electrode 13 are formed is described in the above embodiment (in the order of the steps S2 and S3), the present invention is not limited to this. The P-type electrode 12 and the P-type base electrode 13 can be formed after the Si substrate 1 is removed (for example, in the order of the steps S3 and S2).

Further, although the example where the trench 11 is formed in the AlN buffer layer 2 so as to have a substantially-squared shape when viewed from the direction indicated by arrow A shown in FIG. 1, the present invention is not limited to this. The trench 11 can be formed in the shape of a circle or a stripe.

Furthermore, the AlN buffer layer 2 can be of a high resistance-type.

As described above, according to Embodiment 1 of the present invention, the AlN buffer layer 2 is disposed on the N-type nitride-based compound semiconductor layer 3. The N-type nitride-based compound semiconductor layer 3 and the N-type pad electrode 8 are electrically connected together by the N-type translucent electrode 7 formed so as to cover the trench 11, which is formed in the AlN buffer layer 2 as deep as it reaches the N-type nitride-based compound semiconductor layer 3, and formed on the electrode formation portion 16 of the AlN buffer layer 2. That is, the N-type pad electrode 8 is not formed directly on the N-type nitride-based compound semiconductor layer 3. Therefore, stress generated in the N-type nitride-based compound semiconductor layer 3 when forming the N-type pad electrode 8 is reduced. As a result, there is substantially no possibility that any crack might be caused to the N-type nitride-based compound semiconductor layer 3 and the MQW light-emitting layer 4 formed so as to be in contact with the N-type nitride-based compound semiconductor layer 3.

Further, since the N-type pad electrode 8 is not formed directly on the N-type nitride-based compound semiconductor layer 3, mechanical damage caused to the N-type nitride-based compound semiconductor layer 3 when bonding the Au conductor wire 14 to the N-type pad electrode 8 is reduced. Therefore, there is substantially no possibility that any crack might be caused to the N-type nitride-based compound semiconductor layer 3 and the MQW light-emitting layer 4 formed so as to be in contact with the N-type nitride-based compound semiconductor layer 3.

In this manner, substantially no crack is caused to the N-type nitride-based compound semiconductor layer 3 and the MQW light-emitting layer 4, and therefore the nitride-based compound semiconductor light-emitting element 10 is not electrically shorted. As a result, it is possible to prevent non-uniform light emission, thereby improving the light emission, reliability of the nitride-based compound semiconductor light-emitting element 10.

Further, the AlN buffer layer 2 is hard crystal, and therefore functions so as to prevent damage from being caused when performing dry etching for forming the trench 11 in the AlN buffer layer 2 so as to expose the N-type nitride-based compound semiconductor layer 3, whereby it is possible to reduce damage caused to the N-type nitride-based compound semiconductor layer 3 and the MQW light-emitting layer 4 formed so as to be in contact with the N-type nitride-based compound semiconductor layer 3. As a result, it is possible to reduce leakage current in the MQW light-emitting layer 4, thereby improving the light emission reliability of the nitride-based compound semiconductor light-emitting element 10.

Furthermore, in the nitride-based compound semiconductor light-emitting element 10, when a P-type layer is used as a nitride-based compound semiconductor layer in place of the N-type nitride-based compound semiconductor layer 3, the thickness of the P-type nitride-based compound semiconductor layer can be thinner than that of the N-type nitride-based compound semiconductor layer 3. However, in order to form the trench 11 in the AlN buffer layer 2, it is necessary to perform dry etching. In the case where the N-type nitride-based compound semiconductor layer 3 is used, the etching can be controlled more easily as compared to the case of using the P-type nitride-based compound semiconductor layer which is thinner than the N-type nitride-based compound semiconductor layer 3.

Further still, the width of the trench 11 in which the N-type nitride-based compound semiconductor layer 3 is exposed by dry etching is as narrow as 20 $\mu$m which is minimum necessity, and therefore the region subjected to dry etching is merely a narrow portion of the N-type nitride-based compound semiconductor layer 3. Therefore, it is possible to further reduce the damage caused by dry etching to the N-type nitride-based compound semiconductor layer 3 and the MQW light-emitting layer 4.

Further still, since the Si substrate 1, which could absorb about 50% of light emitted by the MQW light-emitting layer 4, is removed in a production step (step S3 shown in FIG. 2), the nitride-based compound semiconductor light-emitting element 10 does not include the Si substrate 1. Therefore, it is possible to increase luminous efficiency of the nitride-based compound semiconductor element 10.

Further still, since the N-type nitride-based compound semiconductor layer 3 is N-type conductive, impurity concentration can be increased. Therefore, the portions of the N-type nitride-based compound semiconductor layer 3 subjected to dry etching do not make high resistance.

Embodiment 2

Figure 3:
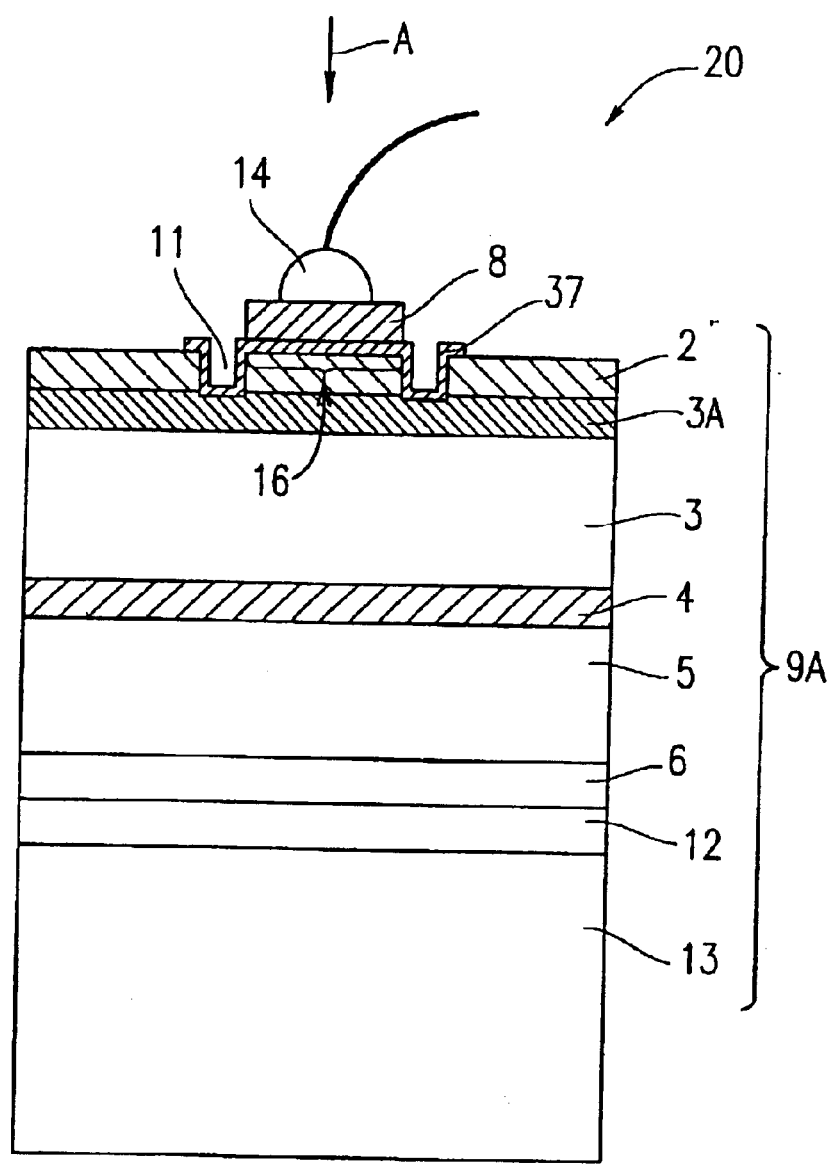
FIG. 3 is a cross-sectional view of a nitride-based compound semiconductor light-emitting element 20 according to Embodiment 2 of the present invention when viewed from the front.

FIG. 3 is a cross-sectional view of a nitride-based compound semiconductor light-emitting element 20 according to Embodiment 2 of the present invention when viewed from the front. In FIG. 3, the same elements as those of the nitride-based compound semiconductor light-emitting element 10 according to Embodiment 1 described with reference to FIG. 1 are denoted by the same reference numerals, and the description thereof will be omitted. The nitride-based compound semiconductor light-emitting element 20 according to Embodiment 2 is different from the nitride-based compound semiconductor light-emitting element 10 according to Embodiment 1 in that a nitride-based compound semiconductor layer 3A including N-type indium (In) is further disposed on the N-type nitride-based compound semiconductor layer 3.

The nitride-based compound semiconductor light-emitting element 20 includes a laminated body 9A having a substantially rectangular parallelepiped shape.

The laminated body 9A includes: a P-type base electrode (conductive layer) 13 having a substantially rectangular parallelepiped shape; a P-type electrode 12 disposed on the P-type base electrode 13; a P-type nitride-based compound semiconductor contact layer 6 disposed on the P-type electrode 12; a P-type nitride-based compound semiconductor layer 5 disposed on the P-type nitride-based compound semiconductor contact layer 6; an MQW light-emitting layer 4 disposed on the P-type nitride-based compound semiconductor layer 5; an N-type nitride-based compound semiconductor layer 3 disposed on the MQW light-emitting layer 4; the nitride-based compound semiconductor layer 3A including N-type In disposed on the N-type nitride-based compound semiconductor layer 3; and an AlN buffer layer 2 disposed on the nitride-based compound semiconductor layer 3A including N-type In.

The nitride-based compound semiconductor layer 3A including N-type In is formed of, for example, an N-type InGaN layer. Similar to Embodiment 1, the N-type nitride-based compound semiconductor layer 3 is formed of, for example, an N-type GaN layer.

The AlN buffer layer 2 includes a trench 11 around a substantial center portion thereof. The trench 11 has a depth as deep as it reaches the N-type nitride-based compound semiconductor layer 3A including N-type In, so that portions of the N-type nitride-based compound semiconductor layer 3A including N-type In are exposed along the trench 11. The AlN buffer layer 2 includes in the substantial center thereof an electrode formation portion 16 having a substantially-squared shape defined by the trench 11.

An N-type translucent electrode 37 is formed so as to cover the trench 11 formed in the AlN buffer layer 2 and the electrode formation portion 16 formed in a surface region of the AlN buffer layer 2, so that the N-type nitride-based compound semiconductor layer 3A including N-type In and the N-type translucent electrode 37 are electrically connected together. An N-type pad electrode 8 is formed on the N-type translucent electrode 37, which is formed on the electrode formation portion 16, so as to inject current into the MQW light-emitting layer 4 via the N-type nitride-based compound semiconductor layer 3A including N-type In and the N-type nitride-based compound semiconductor layer 3, so that the N-type nitride-based compound semiconductor layer 3 and the N-type pad electrode 8 are electrically connected together via the N-type translucent electrode 37. An Au conductor wire 14 is bonded to the N-type pad electrode 8 so as to externally supply current to the N-type pad electrode 8.

The P-type electrode 12 and the P-type base electrode 13, which are formed of metal films, block light emitted by the MQW light-emitting layer 4. The AlN buffer layer 2 having a translucent property transmits light emitted by the MQW light-emitting layer 4. Accordingly, the top surface of the AlN buffer layer 2 is used as a main light-emitting surface of the nitride-based compound semiconductor light-emitting element 20.

Next, a method for producing the nitride-based compound semiconductor light-emitting element 20 of FIG. 3 will be described on a step-by-step basis.

Figure 4:
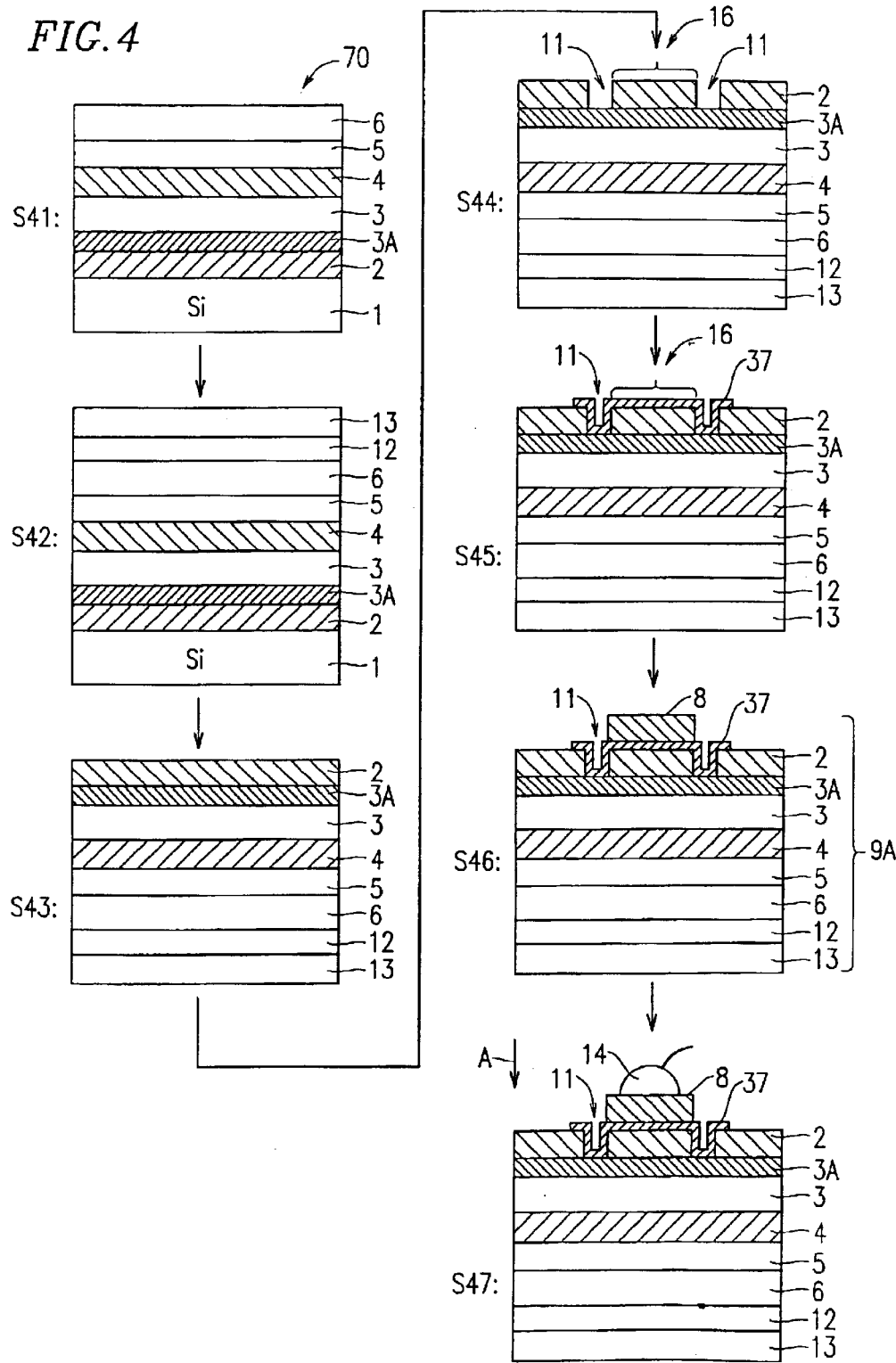
FIG. 4 is a diagram showing the steps of producing the nitride-based compound semiconductor light-emitting element 20 of FIG. 3.

FIG. 4 is a diagram showing the steps of producing the nitride-based compound semiconductor light-emitting element 20.

Step S41: The AlN buffer layer 2, the N-type nitride-based compound semiconductor layer 3A including N-type In, the N-type nitride-based compound semiconductor layer 3, the MQW light-emitting layer 4, the P-type nitride-based compound semiconductor layer 5, and the P-type nitride-based compound semiconductor contact layer 6 are deposited over the Si substrate 1 in this order using an MOCVD apparatus such that each layer has a prescribed thickness.

More specifically, the top surface of the Si substrate 1 is cleaned firstly. Then, the Si substrate 1 is placed in the MOCVD apparatus. The AlN buffer layer 2 is deposited on the Si substrate 1 in the MOCVD apparatus so as to have a thickness of about 150 nm. An N-type InGaN layer is formed as the N-type nitride-based compound semiconductor layer 3A including N-type In on the AlN buffer layer 2 so as to have a thickness of about 100 nm. The thickness of the N-type InGaN layer is preferably from 100 nm or more to 500 nm or less. When the thickness of the N-type InGaN layer is less than 100 nm, the N-type InGaN layer is greatly influenced by damage caused by dry etching for forming the AlN buffer layer 2. When the thickness of the N-type InGaN layer is more than 500 nm, crystallinity of the N-type InGaN layer is deteriorated. As a result, crystallinity of the N-type-nitride-based compound semiconductor layer 3, which is formed so as to be in contact with the N-type nitride-based compound semiconductor layer 3A including N-type In, and crystallinity of the MQW light-emitting layer 4 are also deteriorated. This is because the N-type nitride-based compound semiconductor layer 3A including N-type In contributes to a reduction in the influence of damage caused by etching and maintenance/improvement of crystallinity of the MQW light-emitting layer 4. The composition ratio of the N-type InGaN layer is set so as not to absorb light emitted by the MQW light-emitting layer 4.

Next, the N-type nitride-based compound semiconductor layer 3 is formed on the N-type nitride-based compound semiconductor layer 3A including N-type In so as to have a thickness of about 600 nm. Then, the MQW light-emitting layer 4, the P-type nitride-based compound semiconductor layer 5, and the P-type nitride-based compound semiconductor contact layer 6 are deposited over the N-type nitride-based compound semiconductor layer 3 in this order. The thicknesses of the MQW light-emitting layer 4, the P-type nitride-based compound semiconductor layer 5, and the P-type nitride-based compound semiconductor contact layer 6 are about 40 nm, about 10 nm, and about 150 nm, respectively. In this manner, a wafer 70 is obtained.

Step S42: The wafer 70 is removed from the MOCVD apparatus and Pd (palladium) is formed as the P-type electrode 12 on the P-type nitride-based compound semiconductor contact layer 6 so as to have a thickness of about 30 nm. Then, Ni (nickel) is formed as the P-type base electrode 13 on the P-type electrode 12 so as to have a thickness of about 80 $\mu$m.

Step S43: The Si substrate 1 is removed using a hydrofluoric acid-based etchant which is a mixed liquid in which the proportion of hydrofluoric acid to nitric acid to acetic acid is 10:5:2. Note that the etchant is not limited to the above mixed liquid.

Step S44: The AlN buffer layer 2 is etched by dry etching, such as RIE, using chlorine-based gas so as to expose portions of the N-type nitride-based compound semiconductor layer 3A including N-type In. As a result, the trench 11 is formed around a substantial center portion of the AlN buffer layer 2 so as to have the shape of a square in which the length of one side is about 120 µm. The width of the trench 11 is about 15 µm. The electrode formation portion 16 defined by the trench 11 is formed in the substantial center portion of the AlN buffer layer 2.

Step S45: Metal (e.g., Hf/Ti) of 8 nm in thickness is formed as the N-type translucent electrode 37 so as to cover the trench 11 and the electrode formation portion 16. In this case, the thickness of the formed Hf and Ti are 3 nm and 5 nm, respectively. This formation allows the N-type translucent electrode 37 and the N-type nitride-based compound semiconductor layer 3A including N-type In to be in electrical contact with each other.

Step S46: Au is formed as the N-type pad electrode 8 on the N-type translucent electrode 37, which is formed on the electrode formation portion 16, so as to have a thickness of about 0.5 µm. In this manner, the laminated body 9A illustrated in FIG. 3 is obtained.

Step S47: Next, the laminated body 9A is separated into squared pieces each having an area of 350 µm×350 µm when viewed from the direction indicated by arrow A shown in FIG. 3. Each squared piece is mounted on a lead frame such that the P-type base electrode 13 is in contact with the bottom of a cup of the lead frame. The P-type base electrode 13 functions as the base of the nitride-based compound semiconductor light-emitting element 20. Next, the Au conductor wire 14 is bonded to the N-type pad electrode 8. In this manner, the nitride-based compound semiconductor light-emitting element 20 of FIG. 3 is obtained. Since the N-type pad electrode 8 does not have a translucent property, a region of the top surface of the AlN buffer layer 2 other than the region where the N-type pad electrode 8 is provided functions as the main light-emitting surface of the nitride-based compound light-emitting element 20. Note that the thickness of each of the above-described layers is merely shown as an example.

Next, referring to FIG. 3, the operation of the nitride-based compound semiconductor light-emitting element 20 obtained according to the above-described steps S41–S47 will be described. Current supplied to the N-type pad electrode 8 by the Au conductor wire 14 is injected into the MQW light-emitting layer 4 via the N-type translucent electrode 37, the N-type nitride-based compound semiconductor layer 3A including N-type In, and the N-type nitride-based compound semiconductor layer 3. The MQW light-emitting layer 4 into which the current is injected emits light. The light emitted by the MQW light-emitting layer 4 passes through the N-type nitride-based compound semiconductor layer 3 and the N-type nitride-based compound semiconductor layer 3A including N-type In, and exits through the main light-emitting surface, which corresponds to the region of the top surface of the AlN buffer layer 2 other than the region where the N-type pad electrode 8 is provided, upwardly, i.e., a direction opposite to thee direction indicated by arrow A shown in FIG. 3.

Although the example of depositing an N-type InGaN layer, which is the N-type nitride-based compound semiconductor layer 3A including N-type In, on an N-type GaN layer, which is the N-type nitride-based compound semiconductor layer 3, is described in the above embodiment, the present invention is not limited to this. A multilayer structure in which an N-type GaN layer and an N-type InGaN layer are deposited alternately can be employed. Alternatively, the N-type InGaN layer is deposited on the N-type GaN layer and an additional N-type GaN layer is deposited on the N-type InGaN layer, such that the N-type InGaN layer can be sandwiched by the N-type GaN layers.

As described above, according to Embodiment 2 of the present invention, the N-type nitride-based compound semiconductor layer 3A including N-type In and the AlN buffer layer 2 are disposed on the N-type nitride-based compound semiconductor layer 3. The N-type nitride-based compound semiconductor layer 3A including N-type In and the N-type pad electrode 8 are electrically connected together by the N-type translucent electrode 37 formed so as to cover the trench 11, which is formed in the AlN buffer layer 2 as deep as it reaches the N-type nitride-based compound semiconductor layer 3A including N-type In, and formed on the electrode formation portion 16 of the AlN buffer layer 2. That is, the N-type pad electrode 8 is not formed directly on the N-type nitride-based compound semiconductor layer 3. Therefore, similar effects to those achieved in Embodiment 1 can be achieved in Embodiment 2.

Further, the N-type InGaN layer, which is the N-type nitride-based compound semiconductor layer 3A including N-type In, includes In which is soft crystal. Because of the above described feature of In, it is possible to further reduce the damage caused to the MQW light-emitting layer 4 when dry etching for forming the trench 11 in the AlN buffer layer 2 is performed such that portions of the N-type nitride-based compound semiconductor layer 3A including N-type In are exposed. As a result, it is possible to reduce leakage current in the MQW light-emitting layer 4, thereby improving the light emission reliability of the nitride-based compound semiconductor light-emitting element 20.

Embodiment 3

Figure 5:
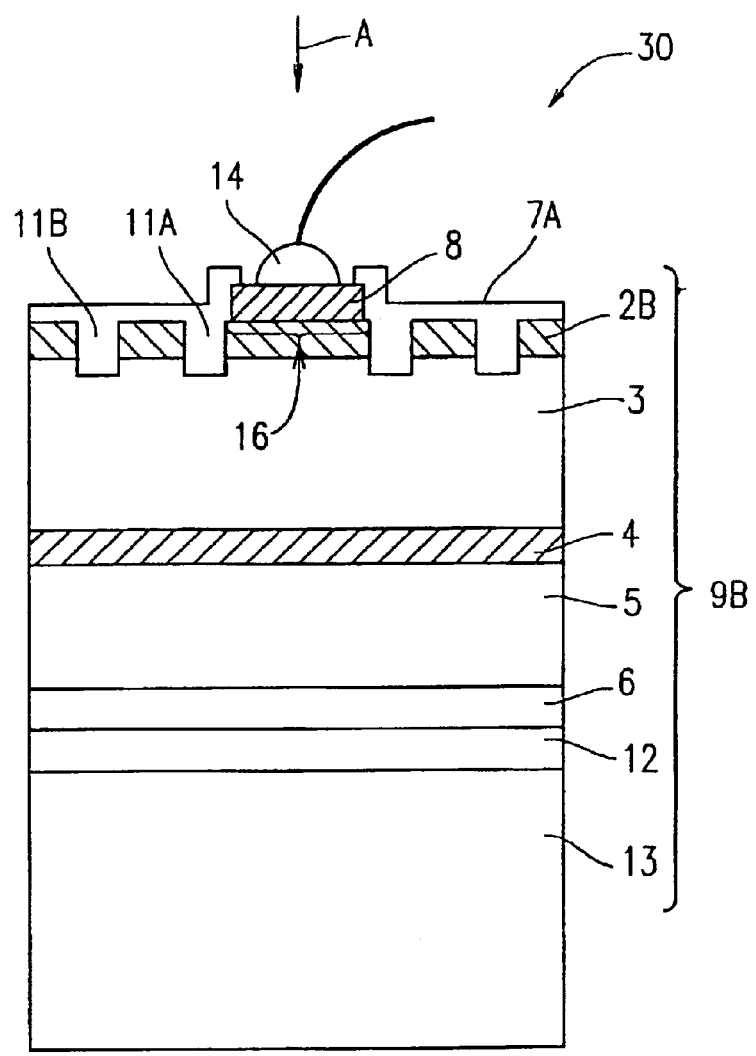
FIG. 5 is a cross-sectional view of a nitride-based compound semiconductor light-emitting element 30 according to Embodiment 3 of the present invention when viewed from the front.

FIG. 5 is a cross-sectional view of a nitride-based compound semiconductor light-emitting element 30 according to Embodiment 3 of the present invention when viewed from the front. In FIG. 5, the same elements as those of the nitride-based compound semiconductor light-emitting element 10 according to Embodiment 1 described with reference to FIG. 1 are denoted by the same reference numerals, and the description thereof will be omitted. In the nitride-based compound semiconductor light-emitting element 30 according to Embodiment 3, an AlGaN buffer layer 2B is provided instead of providing the AlN buffer layer 2, trenches 11A and 11B are formed in an AlGaN buffer layer 2B instead of forming the trench 11, and an N-type oxide semiconductor 7A is provided instead of providing the N-type translucent electrode 7. The nitride-based compound semiconductor light-emitting element 30 includes a laminated body 9B having a substantially rectangular parallelepiped shape.

The laminated body 9B includes: a P-type base electrode 13 having a substantially rectangular parallelepiped shape; a P-type electrode 12 disposed on the P-type base electrode 13; a P-type nitride-based compound semiconductor contact layer 6 disposed on the P-type electrode 12; a P-type nitride-based compound semiconductor layer 5 disposed on the P-type nitride-based compound semiconductor contact layer 6; an MQW light-emitting layer 4 disposed on the P-type nitride-based compound semiconductor layer 5; an N-type nitride-based compound semiconductor layer 3 disposed on the MQW light-emitting layer 4; and an AlGaN buffer layer 2B disposed on the N-type nitride-based compound semiconductor layer 3. Each layer has a prescribed thickness.

The nitride-based compound semiconductor layer 3 is formed of, for example, an N-type GaN layer.

The trench 11A is formed around a substantial center portion of the AlGaN buffer layer 2B such that the trench 11A has a substantially-squared shape when viewed from the direction indicated by arrow A shown in FIG. 5. The trench 11A has a depth as deep as it reaches the N-type nitride-based compound semiconductor layer 3, so that portions of the N-type nitride-based compound semiconductor layer 3 are exposed along the trench 11A. The AlGaN buffer layer 2B includes in the Substantial center portion thereof an electrode formation portion 16 having a substantially-squared shape defined by the trench 11A.

The trench 11B is formed on the outer circumferential side with respect to the trench 11A such that the trench 11B has a substantially-squared shape when viewed from the direction indicated by arrow A shown in FIG. 5. The trench 11B has a depth as deep as it reaches the N-type nitride-based compound semiconductor layer 3, so that portions of the N-type nitride-based compound semiconductor layer 3 are exposed along the trench 11B. Centers of the squares defined by the trenches 11A and 11B are located at the same position when viewed from the direction indicated by arrow A shown in FIG. 5. The trench 11A has the shape of a square in which the length of one side is about 80 $\mu$m. The width of the trench 11A is about 10 $\mu$m. The trench 11B has the shape of a square in which the length of one side is about 150 $\mu$m. The width of the trench 11B is about 15 $\mu$m.

An N-type pad electrode 8 is formed on the electrode formation portion 16. An N-type oxide semiconductor layer 7A is formed in a region of the top surface of the AlGaN buffer layer 2B other than the region where the electrode formation portion 16 is formed, so as to cover the trenches 11A and 11B, and the side surfaces and portions of the top surface of the N-type pad electrode 8. This allows the N-type nitride-based compound semiconductor layer 3 and the N-type pad electrode 8 to be electrically connected together via the N-type oxide semiconductor layer 7A. An Au conductor wire 14 is bonded to the N-type pad electrode 8 so as to externally supply current to the N-type pad electrode 8.

The P-type electrode 12 and the P-type base electrode 13, which are formed of metal films, block light emitted by the MQW light-emitting layer 4. The AlGaN buffer layer 2B is made of a transparent material, and thus transmits light emitted by the MQW light-emitting layer 4. Accordingly, the top surface of the AlGaN buffer layer 2B is used as a main light-emitting surface of the nitride-based compound semiconductor light-emitting element 30.

Next, a method for producing the nitride-based compound semiconductor light-emitting element 30 of FIG. 5 will be described on a step-by-step basis.

Figure 6:
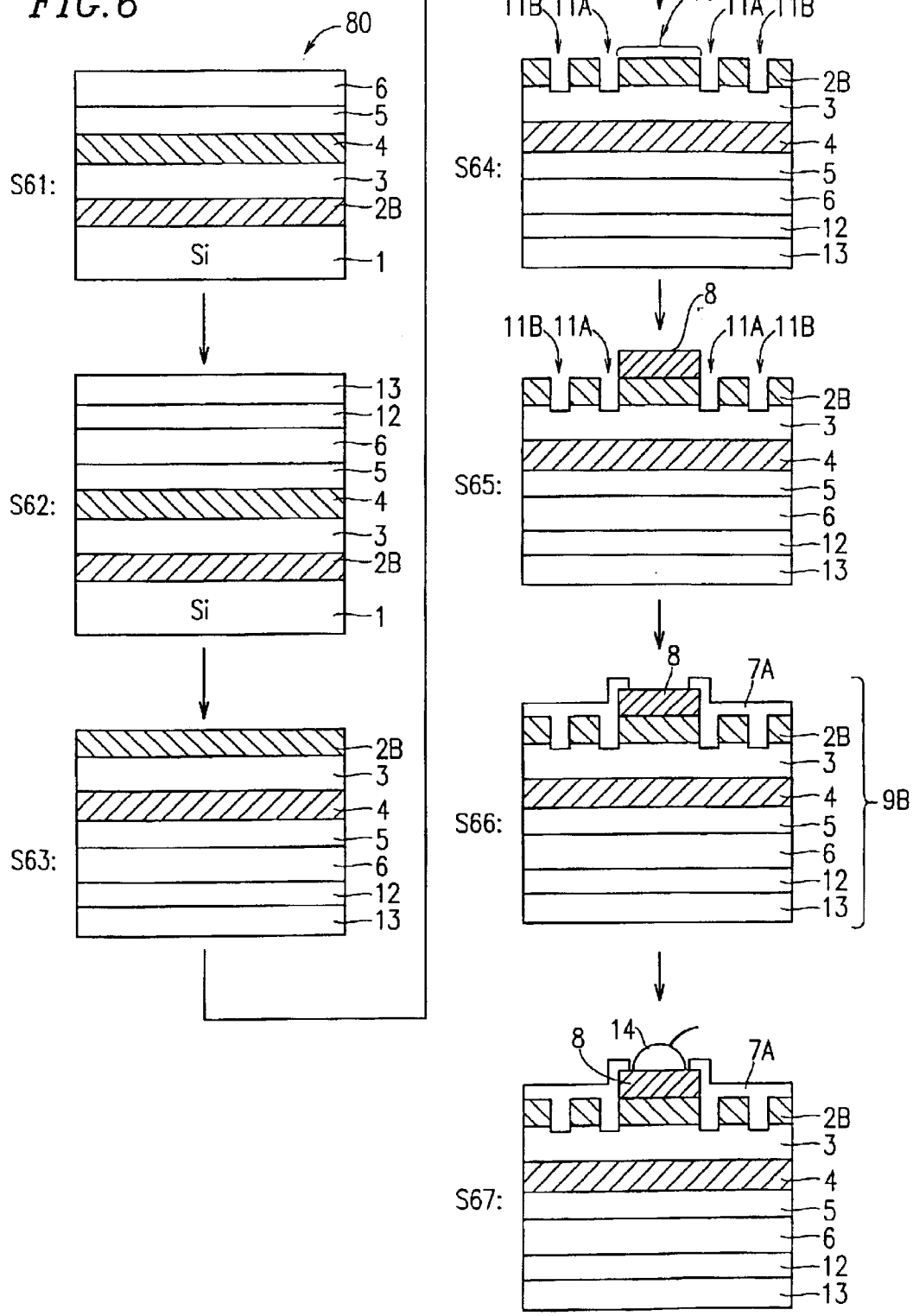
FIG. 6 is a diagram showing the steps of producing the nitride-based compound semiconductor light-emitting element 30 of FIG. 5.

FIG. 6 is a diagram showing the steps of producing the nitride-based compound semiconductor light-emitting element 30.

Step S61: The AlGaN buffer layer 2B, the N-type nitride-based compound semiconductor layer 3, the MQW light-emitting layer 4, the P-type nitride-based compound semiconductor layer 5, and the P-type nitride-based compound semiconductor contact layer 6 are deposited over the Si substrate 1 in this order using an MOCVD apparatus such that each layer has a prescribed thickness.

More specifically, the top surface of the Si substrate 1 is cleaned firstly. Then, the Si substrate 1 is placed in the MOCVD apparatus. The AlGaN buffer layer 2B is deposited on the Si substrate 1 in the MOCVD apparatus so as to have a thickness of about 200 nm. The N-type nitride-based compound semiconductor layer 3, the MQW light-emitting layer 4, the P-type nitride-based compound semiconductor layer 5, and the P-type nitride-based compound semiconductor contact layer 6 are sequentially deposited over the AlGaN buffer layer 2B so as to be about 650 nm, 45 nm, 25 nm, and 250 nm, respectively, in thickness, thereby obtaining a wafer 80.

Step S62: The wafer 80 is removed from the MOCVD apparatus and Pd (palladium) is formed as the P-type electrode 12 on the P-type nitride-based compound semiconductor contact layer 6 so as to have a thickness of about 60 nm. Then, Ni (nickel) is formed as the P-type base electrode 13 on the P-type electrode 12 so as to have a thickness of about 100 $\mu$m.

Step S63: The Si substrate 1 is removed using a hydrofluoric acid-based etchant which is a mixed liquid in which the proportion of hydrofluoric acid to nitric acid to acetic acid is 10:5:3. Note that the etchant is not limited to the above mixed liquid.

Step S64: The AlGaN buffer layer 2B is etched by dry etching, such as RIE, using chlorine-based gas so as to expose portions of the N-type nitride-based compound semiconductor layer 3. As a result, the trench 11A is formed around a substantial center portion of the AlGaN buffer layer 2B so as to have the shape of a square in which the length of one side is about 80 $\mu$m, and the trench 11B is formed on the outer circumferential side with respect to the, trench 11A so as to have the shape of a square in which the length of one side is about 150 $\mu$m. The width of the trenches 11A and 11B are about 10 $\mu$m and about 15 $\mu$m, respectively. The electrode formation portion 16 defined by the trench 11A is formed in the substantial center portion of the AlGaN buffer layer 2B.

Step S65: Au is formed as the N-type pad electrode 8 on the electrode formation portion 16, which is formed on the AlGaN buffer layer 2B, so as to have a thickness of about 1.0 $\mu$m.

Step S66: The N-type oxide semiconductor layer 7A, which is a transparent conductor, is deposited in a region of the top surface of the AlGaN buffer layer 2B other than the region where the electrode formation portion 16 is formed, so as to cover the trenches 11A and 11B and the side surfaces and portions of the top surface of the N-type pad electrode 8. The thickness of the N-type oxide semiconductor layer 7A is about 250 nm. The N-type oxide semiconductor layer 7A is, for example, ITO made of $In_2O_3$ doped with Sn. This allows the N-type nitride-based compound semiconductor layer 3 and the N-type pad electrode 8 to be electrically connected together via the N-type oxide semiconductor layer 7A. In this manner, the laminated body 9B shown in FIG. 5 is obtained.

Step S67: Next, the laminated body 9B is separated into squared pieces each having an area of 400 $\mu$m×400 $\mu$m when viewed from the direction indicated by arrow A shown in FIG. 5. Each squared piece is mounted on a lead frame such that the P-type base electrode 13 is in contact with the bottom of a cup of the lead frame. Next, the Au conductor wire 14 is bonded to the N-type pad electrode 8. In this manner, the nitride-based compound semiconductor light-emitting element 30 of FIG. 5 is obtained. A region of the top surface of the AlN buffer layer 2 other than the region where the N-type pad electrode 8 is provided functions as the main light-emitting surface of the nitride-based compound light-emitting element 30. Note that the thickness of each of the above-described layers is merely shown as an example.

Next, referring to FIG. 5, the operation of the nitride-based compound semiconductor light-emitting element 30 obtained according to the above-described steps S61–S67 will be described. Current supplied to the N-type pad electrode 8 by the Au conductor wire 14 is injected into the MQW light-emitting layer 4 via the N-type oxide semiconductor layer 7A and the N-type nitride-based compound semiconductor layer 3. The MQW light-emitting layer 4 into which the current is injected emits light. The light emitted by the MQW light-emitting layer 4 passes through the N-type nitride-based compound semiconductor layer 3 and exits through the main light-emitting surface, which corresponds to the region of the top surface of the AlGaN buffer layer 2B other than the region where the N-type pad electrode 8 is provided, upwardly, i.e., a direction opposite to the direction indicated by arrow A shown in FIG. 5.

In Embodiment 3 of the present invention, the nitride-based compound semiconductor light-emitting element 30 is configured such that the N-type oxide semiconductor layer 7A is used for connecting the N-type nitride-based compound semiconductor layer 3 and the N-type pad electrode 8 together. However, the present invention is not limited to this. A multilayer structure can be employed such that light transmitting electrodes made of ultra-thin metal films are formed in the trenches 11A and 11B and the N-type oxide semiconductor layer 7A is formed to cover the light transmitting electrodes.

Further, the example of using ITO as the N-type oxide semiconductor layer 7A is shown in Embodiment 3, $SnO_2$ (tin oxide) doped with antimony or gallium or ZnO (zinc oxide) doped with aluminum or gallium can be used as the N-type oxide semiconductor layer 7A.

As described above, according to Embodiment 3 of the present invention, the AlGaN buffer layer 2B is disposed on the N-type nitride-based compound semiconductor layer 3. The trenches 11A and 11B, which are formed in the AlGaN buffer layer 2 as deep as they reach the N-type nitride-based compound semiconductor layer 3 and the N-type pad electrode 8, which is formed on the electrode formation portion 16 of the AlGaN buffer layer 2B, are electrically connected together by the N-type oxide semiconductor layer 7A. That is, the N-type pad electrode 8 is not formed directly on the N-type nitride-based compound semiconductor layer 3. Therefore, similar effects to those achieved in Embodiment 1 can be achieved in Embodiment 3.

Further, the N-type oxide semiconductor layer 7A has a thickness greater than that of a thin film of the N-type translucent electrode 7 in Embodiment 1, whereby it is possible to uniformly inject current into the MQW light-emitting layer 4 as compared to Embodiment 1. Therefore, it is possible to obtain a nitride-based compound semiconductor light-emitting element which emits light more uniformly.

Furthermore, the N-type oxide semiconductor layer 7A has a translucent property, and thus does not block light emitted by the MQW light-emitting layer 4.

Embodiment 4

Figure 7:
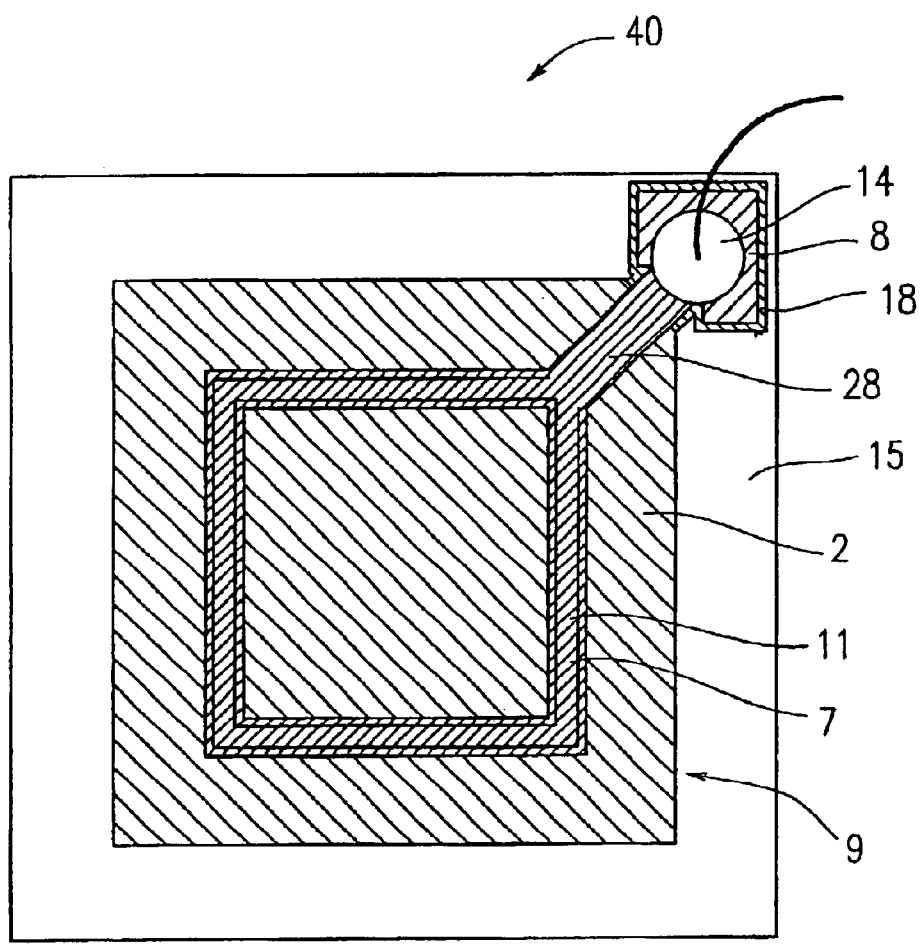
FIG. 7 is a plan view of a nitride-based compound semiconductor element 40 according to Embodiment 4 of the present invention.

FIG. 7 is a plan view of a nitride-based compound semiconductor light-emitting element 40 according to Embodiment 4 of the present invention. In FIG. 7, the same elements as those of the nitride-based compound semiconductor light-emitting element 10 according to Embodiment 1 described with reference to FIG. 1 are denoted by the same reference numerals, and the description thereof will be omitted. The nitride-based compound semiconductor light-emitting element 40 according to Embodiment 4 is different from the nitride-based compound semiconductor light-emitting element 10 according to Embodiment 1 in that the laminated body 9 is provided such that a periphery portion 15 covers the laminated body 9 so as to surround side surfaces of the laminated body 9 and the N-type pad electrode 8 and the Au conductor wire 14 are provided on the periphery portion 15.

The nitride-based compound semiconductor light-emitting element 40 includes the laminated body 9 having a substantially rectangular parallelepiped shape and the periphery portion 15 having a hollowed rectangular parallelepiped shape, which is provided so as to surround the laminated body 9 around the side surfaces thereof. Note that no light-emitting region is provided on the periphery portion 15.

Similarly to the nitride-based compound semiconductor light-emitting element 10 according to Embodiment 1 described with reference to FIG. 1, the laminated body 9 includes: a P-type base electrode 13 having a substantially rectangular parallelepiped shape; a P-type electrode 12 disposed on the P-type base electrode 13; a P-type nitride-based compound semiconductor contact layer 6 disposed on the P-type electrode 12; a P-type nitride-based compound semiconductor layer 5 disposed on the P-type nitride-based compound semiconductor contact layer 6; an MQW light-emitting layer 4 disposed on the P-type nitride-based compound semiconductor layer 5; an N-type nitride-based compound semiconductor layer 3 disposed on the MQW light-emitting layer 4; and an AlN buffer layer 2 disposed on the N-type nitride-based compound semiconductor layer 3. Each layer has a prescribed thickness. A trench 11 is formed around a substantial center portion of the AlN buffer layer 2 so as to have a depth as deep as it reaches the N-type nitride-based compound semiconductor layer 3. The trench 11 has a substantially-squared frame shape.

The N-type translucent electrode 7 is formed so as to cover the trench 11. This allows the N-type nitride-based compound semiconductor layer 3 and the N-type translucent electrode 7 to be electrically connected together. An insulating layer 18 is formed on one corner of the periphery portion 15 so as to be adjacent to the AlN buffer layer 2. The insulating layer 18 is made of $SiO_2$ or the like. The insulating layer 18 can be a high resistance layer.

The N-type pad electrode 8 is formed on the insulating layer 18. A coupling layer 28 is formed so as to electrically couple the N-type translucent electrode 7 and the N-type pad electrode 8 together. This allows the N-type nitride-based compound semiconductor layer 3 and the N-type pad electrode 8 to be electrically connected together via the N-type translucent electrode 7 and the coupling layer 28.

An Au conductor wire 14 is bonded to the N-type pad electrode 8 so as to externally supply current to the N-type pad electrode 8.

In the nitride-based compound semiconductor light-emitting element 40 having the above structure, when current is supplied to the N-type pad electrode 8 by the Au conductor wire 14, the current is injected into the MQW light-emitting layer 4 via the coupling layer 28, the N-type translucent electrode 7, and the N-type nitride-based compound semiconductor layer 3. The MQW light-emitting layer 4 into which the current is injected emits light. The light emitted by the MQW light-emitting layer 4 passes through the N-type nitride-based compound semiconductor layer 3 and exits through the main light-emitting surface formed on the AlN buffer layer 2.

As described above, according to Embodiment 4 of the present invention, the N-type pad electrode 8 is formed on one corner of the periphery portion 15 provided so as to surround the laminated body 9 around the side surfaces thereof. That is, the N-type pad electrode 8 is formed in a region other than a region from which light is emitted, and is not formed directly on the N-type nitride-based compound semiconductor layer 3. Stress generated in the N-type nitride-based compound semiconductor layer 3 and the MQW light-emitting layer 4 when forming the N-type pad electrode 8 is further reduced. Therefore, there is substantially no possibility that any crack might be caused to the N-type nitride-based compound semiconductor layer 3 and the MQW light-emitting layer 4.

Further, since the N-type pad electrode 8 is formed on one corner of the periphery portion 15, mechanical damage caused to the N-type nitride-based compound semiconductor layer 3 and the MQW light-emitting layer 4 when bonding the Au conductor wire 14 to the N-type pad electrode 8 is further reduced. Therefore, there is substantially no possibility that any crack might be caused to the N-type nitride-based compound semiconductor layer 3 and the MQW light-emitting layer 4.

Furthermore, since the N-type pad electrode 8 is formed on one corner of the periphery portion 15 provided so as to surround the laminated body 9 around the side surfaces thereof, the N-type pad electrode 8 does not block light emitted by the, MQW light-emitting layer 4. Therefore, it is possible to further increase the luminous efficiency of a nitride-based compound semiconductor element.

Embodiment 5

Figure 8:
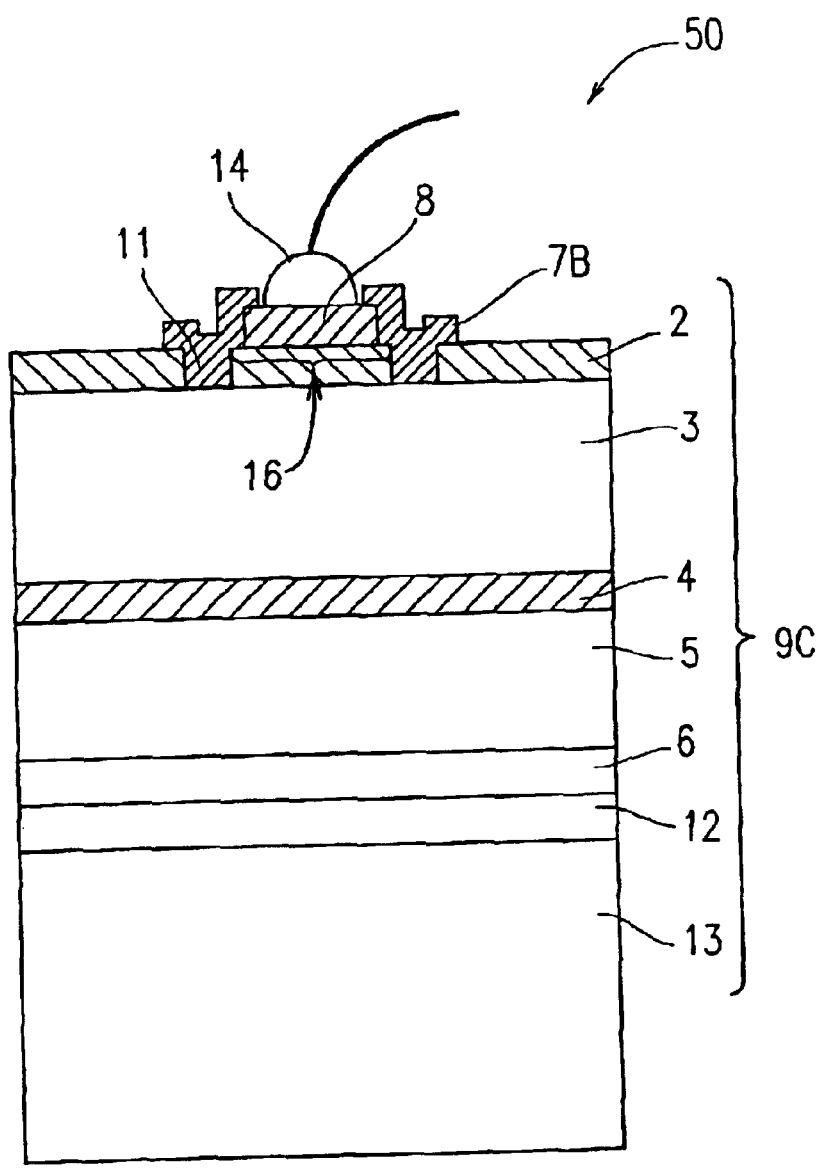
FIG. 8 is a cross-sectional view of a nitride-based compound semiconductor light-emitting element 50 according to Embodiment 5 of the present invention when viewed from the front.
Figure 9:
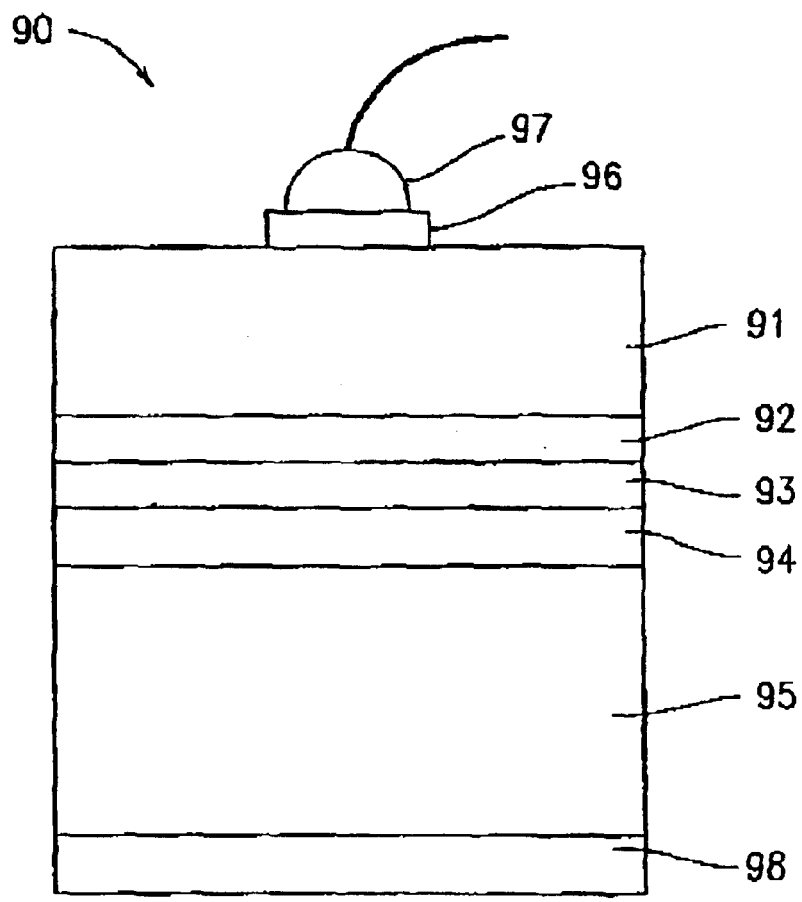
FIG. 9 is a cross-sectional view of a conventional nitride-based compound semiconductor light-emitting element 90 when viewed from the front.

FIG. 8 is a cross-sectional view of a nitride-based compound semiconductor light-emitting element 50 according to Embodiment 5 of the present invention when viewed from the front. In FIG. 8, the same elements as those of the nitride-based compound semiconductor light-emitting element 10 according to Embodiment 1 described with reference to FIG. 1 are denoted by the same reference numerals, and the description thereof will be omitted. In the nitride-based compound semiconductor light-emitting element 50 according to Embodiment 5, an N-type thick-film metal electrode 7B is provided instead of providing the N-type translucent electrode 7. Unlike the N-type translucent electrode 7 according to Embodiment 1 of the present invention, the N-type thick-film metal electrode 7B is not formed on the electrode formation portion 16 of the AlN buffer layer 2.

Similar to the, nitride-based compound semiconductor light-emitting element 10 according to Embodiment 1, the nitride-based compound semiconductor light-emitting element 50 includes a laminated body 9C having a substantial rectangular parallelepiped shape. The N-type pad electrode 8 is formed on the electrode formation portion 16. The N-type thick-film metal electrode 7B is formed in a trench 11 so as to cover side surfaces and portions of the top surface of the N-type pad electrode 8. An Au conductor wire 14 is bonded to the N-type pad electrode 8 so as to externally supply current to the N-type pad electrode 8.

The nitride-based compound semiconductor light-emitting element 50 having the above structure is produced in a manner described below. Similar to Embodiment 1 of the present invention, steps S1–S4 shown in FIG. 2 are performed so as to form the P-type electrode 12 and the P-type base electrode 13, and after the Si substrate 1 is removed, the trench 11 is formed in the AlN buffer layer 2.

Step S5': Au is formed as the N-type pad electrode 8 on the electrode formation portion 16 so as to have a thickness of about 0.5 $\mu$m.

Step S6': Ti having a thickness of about 15 nm is formed as the N-type thick-film metal electrode 7B so as to cover the trench 11 and the side surfaces and portions of the top surface of the N-type pad electrode 8. Al is formed so as to have a thickness of about 150 $\mu$m. This allows the N-type nitride-based compound semiconductor layer 3 and the N-type pad electrode 8 to be electrically connected together via the N-type thick-film metal electrode 7B.

The operation of the nitride-based compound semiconductor light-emitting element 50 obtained according to the above-described steps will be described. Current supplied to the N-type pad electrode 8 by the Au conductor wire 14 is injected into the MQW light-emitting layer 4 via the N-type thick-film metal electrode 7B and the N-type nitride-based compound semiconductor layer 3. The MQW light-emitting layer 4 into which the current is injected emits light. The light emitted by the MQW light-emitting layer 4 passes through the N-type nitride-based compound semiconductor layer 3 and exits through the main light-emitting surface, which corresponds to a region of the top surface of the AlN buffer layer 2 other than the region where the N-type pad electrode 8 is provided, upwardly.

In this manner, according to Embodiment 5 of the present invention, the AlN buffer layer 2 is disposed on the N-type nitride-based compound semiconductor layer 3. As described above, the N-type nitride-based compound semiconductor layer 3 and the N-type pad electrode 8 are electrically connected together via the N-type thick-film metal electrode 7B. That is, the N-type pad electrode 8 is not formed directly on the N-type nitride-based compound semiconductor layer 3. Therefore, similar effects to those achieved in Embodiment 1 can be achieved in Embodiment 5

Further, the N-type thick-film metal electrode 7B is made of a thick-film metal having a thickness greater than that of the N-type translucent electrode 7 in Embodiment 1, and thus there is no need to highly accurately control the film thickness of the N-type thick-film metal electrode 7B. Therefore, it is possible to increase productivity in producing nitride-based compound semiconductor light-emitting elements.

As described above, according to the present invention, it is possible to provide a nitride-based compound semiconductor light-emitting element having high light emission reliability and a method for producing such an element.

Further, according to the present invention, it is possible to provide a nitride-based compound semiconductor light-emitting element having substantially no possibility of generation of a crack and a method for producing such an element.

Furthermore, according to the present invention, it is possible to provide a nitride-based compound semiconductor light-emitting element having high luminous efficiency and a method for producing such an element.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride-based compound semiconductor light-emitting element comprising:
   a P-type electrode;
   a P-type nitride-based compound semiconductor layer disposed on the P-type electrode;
   a light-emitting layer disposed on the P-type nitride-based compound semiconductor layer and emitting light;
   a nitride-based compound semiconductor layer disposed on the light-emitting layer and transmitting light emitted by the light-emitting layer therethrough;
   a buffer layer disposed on the nitride-based compound semiconductor layer and transmitting the light therethrough, wherein the buffer layer is made of a nitride-based compound semiconductor material and a trench is formed in the buffer layer so as to expose portions of the nitride-based compound semiconductor layer; and an N-type electrode disposed so as to cover the trench and electrically connected to the nitride-based compound semiconductor layer.

2. A nitride-based compound semiconductor light-emitting element according to claim 1, wherein the buffer layer is an AlN layer.

3. A nitride-based compound semiconductor light-emitting element according to claim 1, wherein the nitride-based compound semiconductor layer is made of at least one material selected from the group consisting of GaN and InGaN.

4. A nitride-based compound semiconductor light-emitting element according to claim 1, wherein the buffer layer is deposited so as to cover the entire surface of the nitride-based compound semiconductor layer.

5. A nitride-based compound semiconductor light-emitting element according to claim 1, wherein:

the buffer layer has an electrode formation portion defined by the trench; and the N-type electrode is formed so as to cover the trench and the electrode formation portion.

6. A nitride-based compound semiconductor light-emitting element according to claim 5, further comprising a pad electrode disposed on the N-type electrode, which is formed on the electrode formation portion, and electrically connected to the N-type electrode, wherein the pad electrode injects current into the nitride-based compound semiconductor layer and the light-emitting layer.

7. A nitride-based compound semiconductor light-emitting element according to claim 1, wherein:

the buffer layer includes an electrode formation portion defined by the trench; and the element further comprises a pad electrode disposed on the electrode formation portion and electrically connected to the N-type electrode.

8. A nitride-based compound semiconductor light-emitting element according to claim 1, further comprising a pad electrode disposed at a position so as not to block light emitted by the light-emitting layer and electrically connected to the N-type electrode.

9. A nitride-based compound semiconductor light-emitting element according to claim 1, wherein the N-type electrode is a translucent thin film including metal.

10. A nitride-based compound semiconductor light-emitting element according to claim 1, wherein the N-type electrode is an oxide semiconductor which is a translucent conductor.

11. A nitride-based compound semiconductor light-emitting element according to claim 1, further comprising a conductive layer in a lower portion of the P-type electrode, wherein the conductive layer supports a laminated body including: the P-type electrode, the P-type nitride-based compound semiconductor layer, the light-emitting layer, the nitride-based compound semiconductor layer, the buffer layer, and the N-type electrode.

12. A nitride-based compound semiconductor light-emitting element according to claim 11, wherein the conductive layer is a metal layer formed by plating.

13. A nitride-based compound semiconductor light-emitting element according to claim 11, wherein the conductive layer is formed by a metal plate or a semiconductor substrate bonded to the P-type electrode.

* * * * *